United States Patent
Krajewski et al.

(10) Patent No.: US 8,618,408 B2
(45) Date of Patent: *Dec. 31, 2013

(54) PROTECTIVE LAYERS FOR A GLASS BARRIER IN A PHOTOVOLTAIC DEVICE

(75) Inventors: Todd Krajewski, Mountain View, CA (US); Kedar Hardikar, San Jose, CA (US)

(73) Assignee: MiaSole, Santa Clara, CA (US)

( * ) Notice: Subject to any disclaimer, the term of this patent is extended or adjusted under 35 U.S.C. 154(b) by 259 days.

This patent is subject to a terminal disclaimer.

(21) Appl. No.: 12/824,605

(22) Filed: Jun. 28, 2010

(65) Prior Publication Data

US 2011/0315206 A1 Dec. 29, 2011

(51) Int. Cl.
- *H02N 6/00* (2006.01)
- *H01L 31/042* (2006.01)
- *H01L 31/00* (2006.01)
- *H01L 21/00* (2006.01)

(52) U.S. Cl.
USPC ........... 136/256; 136/244; 136/251; 136/252; 136/259; 438/64

(58) Field of Classification Search
USPC ................. 136/244, 246, 251, 252, 256, 259; 438/64
See application file for complete search history.

(56) References Cited

U.S. PATENT DOCUMENTS

| | | | |
|---|---|---|---|
| 6,355,125 B1 * | 3/2002 | Tahon et al. | 156/99 |
| 2004/0081831 A1 * | 4/2004 | Shoshi et al. | 428/422.8 |
| 2007/0295388 A1 * | 12/2007 | Adriani et al. | 136/251 |

* cited by examiner

*Primary Examiner* — Jonathan Johnson
*Assistant Examiner* — Lindsey Bernier
(74) *Attorney, Agent, or Firm* — The Marbury Law Group PLLC (57) ABSTRACT

A photovoltaic device includes at least one photovoltaic cell, a flexible glass layer formed over the at least one photovoltaic cell, and a transparent planarizing hardcoat formed on the glass layer. The planarizing hardcoat may be in compressive stress and the glass layer may be in tension.

16 Claims, 5 Drawing Sheets

PROTECTIVE LAYERS FOR A GLASS BARRIER IN A PHOTOVOLTAIC DEVICE

FIELD OF THE INVENTION

Embodiments described herein relate generally to photovoltaic devices and modules, and more specifically to flexible photovoltaic devices and modules comprising protective films, layers and coatings.

BACKGROUND OF THE INVENTION

Copper indium diselenide ($CuInSe_2$, or CIS) and its higher band gap variants, such as copper indium gallium diselenide ($Cu(In,Ga)Se_2$, or CIGS), and any of these compounds with sulfur replacing some of the selenium represent a group of materials, referred to as copper indium selenide CIS based alloys, have desirable properties for use as the absorber layer in thin-film solar cells as used in photovoltaic modules. These layers are susceptible to damage from water and/or water vapor.

Photovoltaic ("PV") modules used in residential structures and roofing materials for generating electricity often require additional protection from environmental damage, such as an ingress of water, that can reduce an active lifetime of the photovoltaic system. Additionally, these modules require protection from hail, rocks, or other objects that may impact their surfaces.

Rigid or flexible sheets of glass may be used to support and/or provide protection to the underlying semiconductor layers. These sheets, however, may themselves be susceptible to cracking when impacted, thereby exposing the semiconductor layers to moisture and other environmental conditions that diminish the lifetime of the cell or completely destroy it. Also, certain impacts may cause cracks that do not extend to the underlying semiconductor layers initially, but may propagate over time, for example during thermal expansion and contraction cycles resulting from change of temperature during the day, or over several months and seasons.

Additionally, flexible glasses are susceptible to weakness from micro scratches produced during processing, and/or abrasion during weathering. These microscratches and abrasions act as stress concentrators and/or crack initiation sites which may compromise resistance to impact and/or resistance to moisture barrier properties.

Furthermore, plural impacts over a narrow radius can exceed the tensile strength of the glass and cause breakage.

SUMMARY

One embodiment of this invention provides a photovoltaic device, including at least one photovoltaic cell, a flexible glass layer formed over the at least one photovoltaic cell, and a transparent planarizing hardcoat formed on the glass layer wherein the planarizing hardcoat is in compressive stress and the glass layer is in tension.

Another embodiment provides a method of making a photovoltaic device, including the steps of providing at least one photovoltaic cell, and forming a flexible glass layer having a transparent planarizing hardcoat over the at least one photovoltaic cell such that the planarizing hardcoat is in compressive stress and the glass layer is in tension.

Another embodiment provides a photovoltaic device, including at least one photovoltaic cell, a flexible glass layer formed over the at least one photovoltaic cell, and a transparent and abrasion resistant film comprising an organic-inorganic hybrid material formed over the glass layer.

Another embodiment provides a method of making photovoltaic device, including the steps of providing at least one photovoltaic cell, and forming a glass layer over the at least one photovoltaic cell. A transparent and abrasion resistant film comprising an organic-inorganic hybrid material is located over the glass layer.

Another embodiment provides a photovoltaic device, including at least one photovoltaic cell, a flexible glass layer formed over the at least one photovoltaic cell. The flexible glass layer has a first major surface facing the at least one photovoltaic cell and a second major surface facing away from the at least one photovoltaic cell. A first encapsulant layer is formed over the first major surface of the flexible glass layer, and has a modulus of less than 100 MPa at room temperature. A second encapsulant layer is formed over the second major surface of the flexible glass layer, and comprises a composite material comprising a polymer matrix containing a filler material.

Another embodiment provides a photovoltaic device, including at least one photovoltaic cell and a flexible glass layer formed over the at least one photovoltaic cell. The flexible glass layer has a first major surface facing the at least one photovoltaic cell and a second major surface facing away from the at least one photovoltaic cell. A first encapsulant layer is formed over a first major surface of the flexible glass layer, and has a modulus of less than 100 MPa at room temperature. A second encapsulant layer is formed over at least a middle portion of a second major surface of the flexible glass layer, and has a thickness of greater than 500 µm and a modulus of less than 100 MPa at room temperature.

Another embodiment provides a photovoltaic device, including at least one photovoltaic cell and a flexible glass layer formed over the at least one photovoltaic cell. The flexible glass layer has a first major surface facing the at least one photovoltaic cell and a second major surface facing away from the at least one photovoltaic cell. A first encapsulant layer is formed over a first major surface of the flexible glass layer, and has a modulus of less than 100 MPa at room temperature. A second encapsulant layer is formed over a second major surface of the flexible glass layer, and has a thickness of less than 500 µm and a modulus of greater than 500 MPa at room temperature.

DESCRIPTION OF THE EMBODIMENTS

As used herein, the term "module" includes an assembly of at least two, preferably more than two photovoltaic cells, such as 3-10,000 cells, for example. The photovoltaic cells of the module can be photovoltaic cells of any type. Each of the photovoltaic cells of the module can be a CIS based alloy (e.g., CIGS) type photovoltaic cell described above. Preferably, the photovoltaic cells of the module are thin film photovoltaic cells. The thin film photovoltaic cells of the module can be located adjacent to each other such that an interconnect provides electrical connection between them. An exemplary interconnect is described in U.S. patent application Ser. No. 11/451,616 filed on Jun. 13, 2006 and incorporated herein by reference in its entirety.

Figure 1:
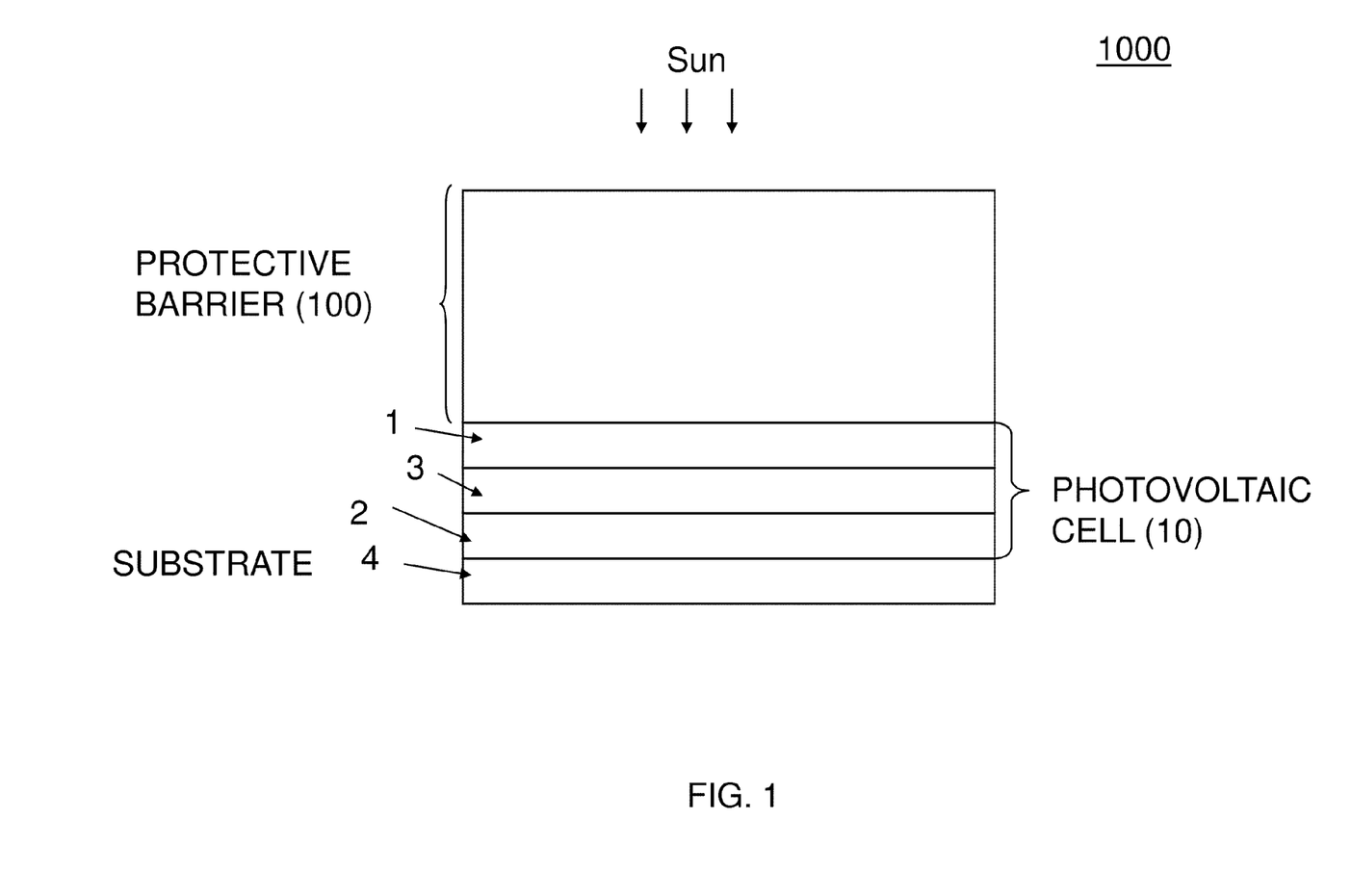
FIG. 1 shows a side cross-sectional view of one embodiment of a photovoltaic device comprising a protective barrier.

FIG. 1 illustrates a photovoltaic device 1000. The photovoltaic device 1000 in FIG. 1 includes: a) a photovoltaic cell 10 that includes a first transparent electrode 1 adapted to face the Sun, a second electrode 2 adapted to face away from the Sun and a photovoltaic material 3 disposed between the first and the second electrodes, and b) a transparent protective barrier 100. Electrode 1 may comprise a transparent conductive metal oxide, such as indium tin oxide, zinc oxide, aluminum zinc oxide or a combination thereof. Electrode 2 may comprise a metal or metal alloy, such as molybdenum or alloys thereof. The photovoltaic material 3 may include a semiconductor p-n or p-i-n junction, such as a p-CIGS absorber and n-CdS layers. The photovoltaic device 1000 may include a substrate 4. In some cases, the substrate 4 can comprise a foil or plate 4 on which an electrode 2 is disposed. In some other cases, the electrode 2 material can be eliminated and the substrate 4 can comprise a conductive plate or foil 4, such as a steel foil, which acts as the second electrode of the cell. Substrate 4 can be a flexible substrate and photovoltaic cell 10 can be a flexible photovoltaic cell which can be rolled up into a roll without breaking or becoming inoperative.

The transparent protective barrier 100 is disposed over the photovoltaic cell 10 to provide environmental protection and impact protection to the cell. When the photovoltaic cell is part of a photovoltaic module, the protective barrier can be formed continuously over other photovoltaic cells in the module. The transparent protective barrier 100 preferably comprises at a thin, coated flexible glass layer. In some cases, the protective barrier 100 can be a self-supporting, i.e., a free standing glass layer. The self-supporting layer can be in a form of a roll, ribbon, web, foil or a sheet. Any suitable glass material may be used for the glass layer, such as soda lime glass, borosilicate glass, low alkali soda lime glass, etc. The glass layer may be sufficiently thin, such as having a thickness of 50-500 μm, to provide flexibility to the glass layer (e.g., so that the glass layer may be rolled up into a roll).

The protective barrier 100 can include one or more transparent sublayers (not shown in FIG. 1). The term "transparent" includes layers and materials which allow at least 75% of visible solar radiation, such as 80-100% of this radiation to be transmitted to the cell(s). In some cases, the transparent protective barrier can also include a weatherable top sheet or layer (not shown in FIG. 1) on the Sun facing side of the barrier), for protecting the cell(s) from moisture. The top sheet or layer may be a fluoropolymer layer, such as a ETFE or FEP weatherable top layer.

The flexible glass layer has one or more inorganic or organic-inorganic hybrid protective layers on the surface of the glass layer that faces the Sun (i.e., on the major surface of the glass layer which faces away from the cell 10). The protective layer(s) may provide one or more of the following advantages: they may fill any existing microcracks and/or prevent formation of new ones, they may prevent water contact and interaction with the glass layer surface or with any defects on the glass layer surface, and/or they may decrease the impulse of impacts and/or increase the impact area when an object (e.g., hail, rocks, tree branches, etc.) impacts the barrier 100.

The photovoltaic device in FIG. 1 can be encapsulated with one or more encapsulating layers (not shown in FIG. 1) between the cell 10 and barrier 100 and below the cell 10. The photovoltaic device 1000 can be formed on a structure, such as a building roof, etc., with the protective barrier 100 formed on the Sun facing side of the photovoltaic cell 10. As noted above, the barrier 100 and cell 10 may be flexible, such that the device 1000 may be rolled up into a roll without breaking or becoming inoperative. Alternatively, the device 1000 may be semi-rigid, meaning that it can be bent without breaking but cannot be rolled up into a roll. The photovoltaic device 1000 can manufactured into a roll, then be transported to its installation location, be unrolled from the roll and installed over the structure at the installation location.

Planarizing Hardcoat

Figure 2A:
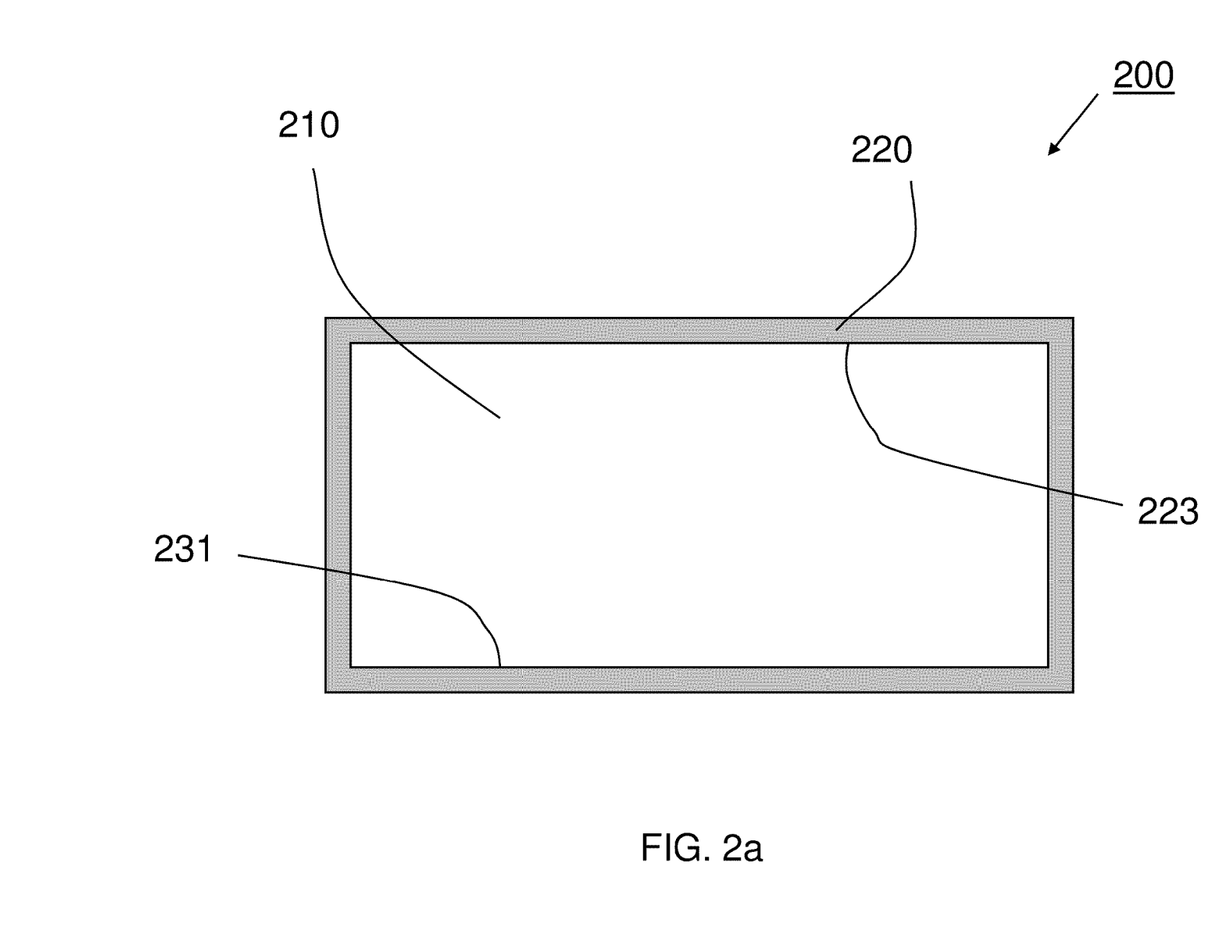
FIG. 2a shows a side cross-sectional view of one embodiment of a photovoltaic device protective barrier comprising a planarizing hardcoat formed on a flexible glass layer.

FIG. 2a illustrates one embodiment 200 of a protective barrier 100 that can be formed on at least one photovoltaic cell 10 in FIG. 1. The protective barrier 200 can comprise the flexible glass layer 210 formed over at least one photovoltaic cell, for example, the at least one of photovoltaic cell 10 of FIG. 1.

Figure 2B:
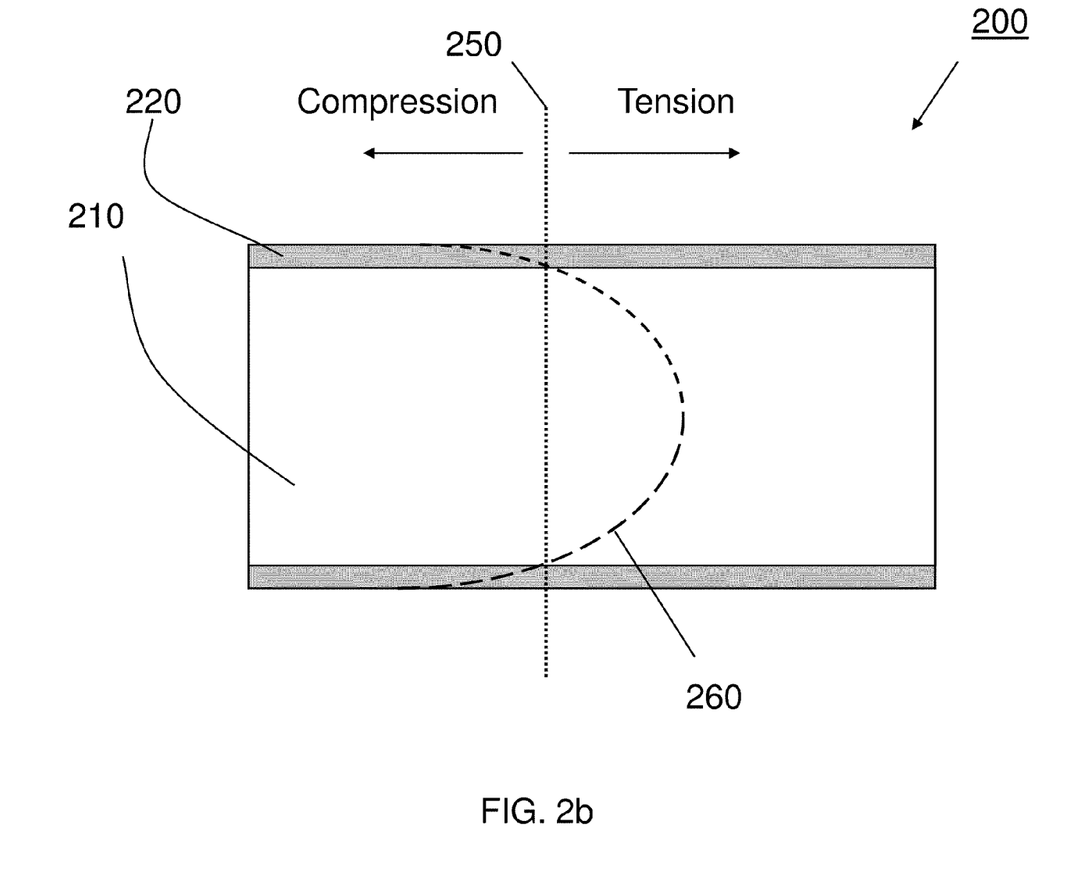
FIG. 2b is a partial side cross-sectional view of the photovoltaic device protective barrier of FIG. 2a with a superimposed stress distribution.

In this embodiment, the protective barrier 200 may include a transparent planarizing hardcoat 220. The transparent planarizing hardcoat can be formed directly on the top surface of the glass layer 210 facing the Sun (i.e., formed on the top surface of layer 210 facing away from the cell 10 shown in FIG. 1). The planarizing hardcoat 220 can be in compressive stress and the glass layer 210 can be in tension as depicted in FIG. 2b. In FIG. 2b, the imaginary vertical dotted line 250 indicates a neutral state between tension and compression. The imaginary dashed line 260 indicates the state of the material through which the dashed line is passing. The position of the dashed line 260 to the left of the dotted line 250 indicates a compressive stress in the material through which the dashed line is passing. The position of the dashed line 260 to the right of the dotted line 250 indicates tension in the material through which the dashed line is passing. Therefore, as shown in FIG. 2b, most or all of the glass layer 210 is in tension while most or all of the hardcoat 220 is in compression. The hardcoat prevents damage to the surface of the glass layer and prevents crack propagation by being in compressive stress, fills any existing microcracks in the glass layer and/or prevents or reduces formation of new ones.

The hardcoat 220 can be formed over at least two major opposing surfaces of the glass layer 210. In other words, the hardcoat can be formed on a first major surface 231 of the glass layer which faces the at least one photovoltaic cell, for example the at least on photovoltaic cell 10 of FIG. 1, and on a second major surface 223 of the glass layer 210 which faces away from the at least one photovoltaic cell. The planarizing hardcoat may be formed over all surfaces of the glass layer 210 (i.e., over the major surfaces and the edge surface(s)).

The hardcoat 220 can provide, among other things, impact and environmental protection to the glass layer 210 and/or to the at least one photovoltaic module, device and/or cell.

The hardcoat 220 can have a thickness of 0.1-5.0 μm. The hardcoat 210 can be harder than the glass 210, can have the same hardness as the glass, or may have a lower hardness than the glass. Preferably, the hardcoat 220 is harder than the glass layer 210. The hardcoat 220 may comprise a moisture barrier, for example a dense moisture barrier.

A material comprising the hardcoat 220 can be selected from any suitable materials, preferably inorganic or hybrid organic-inorganic materials. For example, the hardcoat 220 may comprises silsequioxane, silicon oxide formed from perhyodropolysilazane, aluminum phosphate, silicates, or alumina. Hardcoat 220 can be selected from AQUAMICA® (available from Clariant Corp., Charlotte, N.C.), CERAMABLE organosilicate (available from UpChemical, China), CERABLAK™ (available from Applied Thin Films, Inc., Evanston, Ill.). Hardcoat 220 can be a spin-on type material which is deposited at a low temperature, such as below the glass 210 transition temperature, such as at least 50° C. below the glass transition temperature.

If desired, the hardcoat 220 may be densified after deposition. For example, the hardcoat 220 may be densified by a low temperature anneal. During the optional densification and/or during processing of the photovoltaic device 1000, the planarizing hardcoat material shrinks and goes into compressive stress. In other words, the planarizing hardcoat over the glass can perform as a tempered layer. The planarizing hardcoat can be harder than the glass of glass layer 210 and can be at least as flexible as the glass. The photovoltaic device, with or without the protective barrier 200 described herein, can be rolled into a roll.

Inorganic/Organic Hybrid Film

Figure 3:
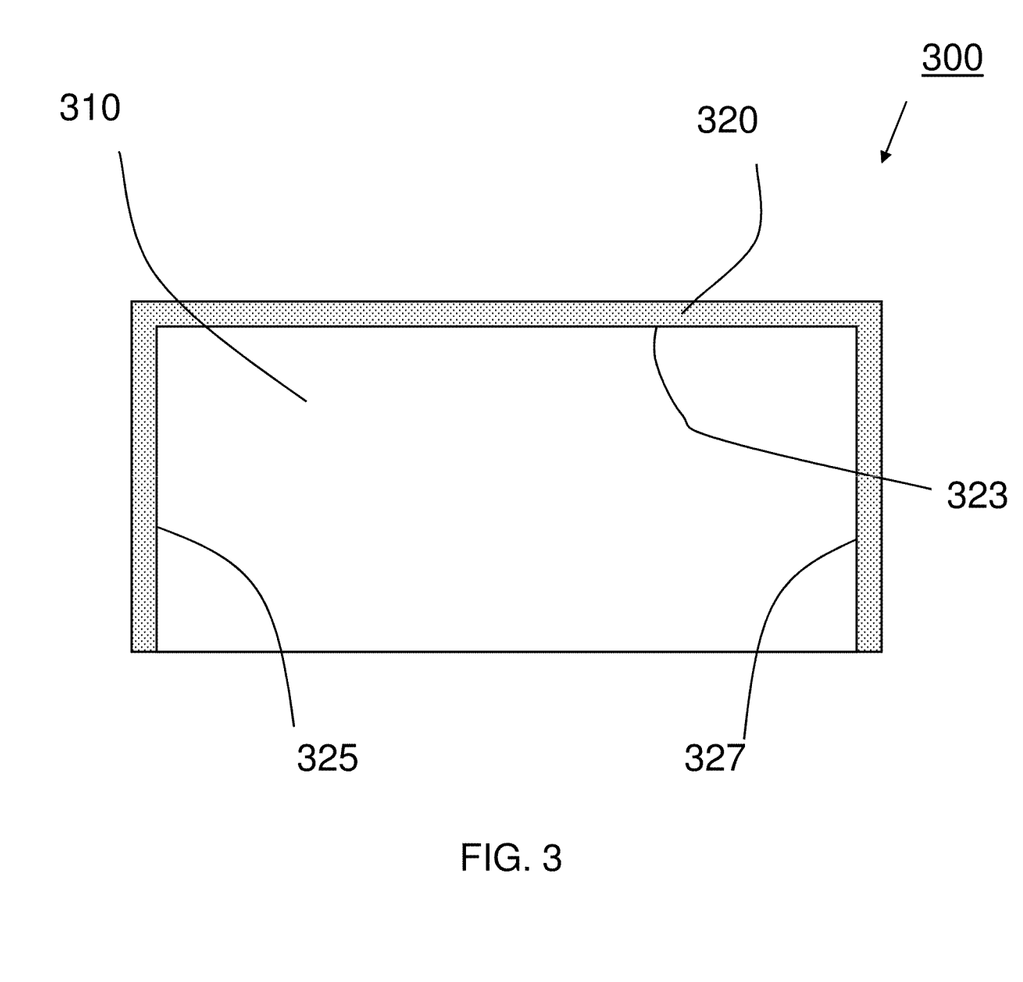
FIG. 3 shows a side cross-sectional view of another embodiment of a photovoltaic device protective barrier comprising an abrasion resistant film comprising an organic-inorganic hybrid material formed over a flexible glass layer.

FIG. 3 illustrates another embodiment 300 of a protective barrier 100 that can be formed on at least one photovoltaic cell, such as the photovoltaic cell 10 in FIG. 1. The protective layer 300 can comprise a flexible glass layer 310 described above formed over at least one photovoltaic cell, for example, the at least one of photovoltaic cell 10 of FIG. 1.

The protective barrier 300 may also include a transparent and abrasion resistant film 320 comprising an organic-inorganic hybrid material formed on or over the glass layer 310. The protective barrier 300 may further include a transparent planarizing hardcoat (not shown in FIG. 3), for example the hardcoat 220 as described with respect to FIG. 2a. The transparent planarizing hardcoat 220 may be formed between the glass layer 310 and the abrasion resistant film 320 such that the hardcoat is in compressive stress while the glass layer 310 is in tension.

The film 320 can be formed over at least one major surface and two minor opposing surfaces of the glass layer 310. In other words, the hardcoat can be formed on or over major surface 323 of the glass layer 310 which faces away from the at least one photovoltaic cell and at least one edge surface of the glass layer 310. The film 320 may be formed over all surfaces of the glass layer 310.

The film 320 can comprise an organic matrix formed of organic material with either inorganic particles (not visible in FIG. 3) dispersed therein or inorganic groups grafted thereon. The particles of film 320 can comprise discrete particles of substantially the same diameter or different diameters, or fibers of substantially the same lengths or of different lengths, or combinations of particles and fibers. Since the film 320 provides scratch and abrasion resistance, the particles or fibers may have a size or diameter than is the same, smaller than or greater than the thickness of the film's 320 matrix. In other words, the particles or fibers make the soft polymer matrix stiffer. However, since the polymer matrix itself would not suffer significant damage from a scratch, the particles or fibers do not need to have a smaller size than the thickness of the film 320 to provide scratch resistance to the film 320. Instead, the film 320 provides scratch resistance to the underlying glass layer 310 which is prone to crack after being scratched.

For example, the film 320 can comprise a polymer and at least one of fumed silica and titanium dioxide particles or fibers. The organic material can comprise a hydrophobic fluoropolymer. The organic material can comprise can comprise vinyltriethoxysilane-tetraethoxysilane-polyfunctional acrylate hybrid polymer hard coat, fluorinated ethylene propylene (FEP) with or without abrasion resistant additives, ultra-high molecular weight polyethylene (UHMWPE), polyether ether ketone (PEEK), ethylene tetrafluoroethylene (ETFE), polyvinylidene fluoride (PVDF), and/or polyhedral oligomeric silsesquioxanes.

The protective layer 300 can provide, among other things, impact and environmental protection to the glass layer and/or to the at least one photovoltaic cell. Therefore, in one embodiment, the film 320 can be weather resistant and/or scratch resistant. The glass layer 310 can have a thickness of 50-500 µm and the film 320 can have a thickness of 1-100 µm.

The photovoltaic device, with or without the protective barrier 300 described herein, is preferably flexible and can be rolled into a roll.

High Modulus Composite and Low Modulus Encapsulating Layers

Figure 4:
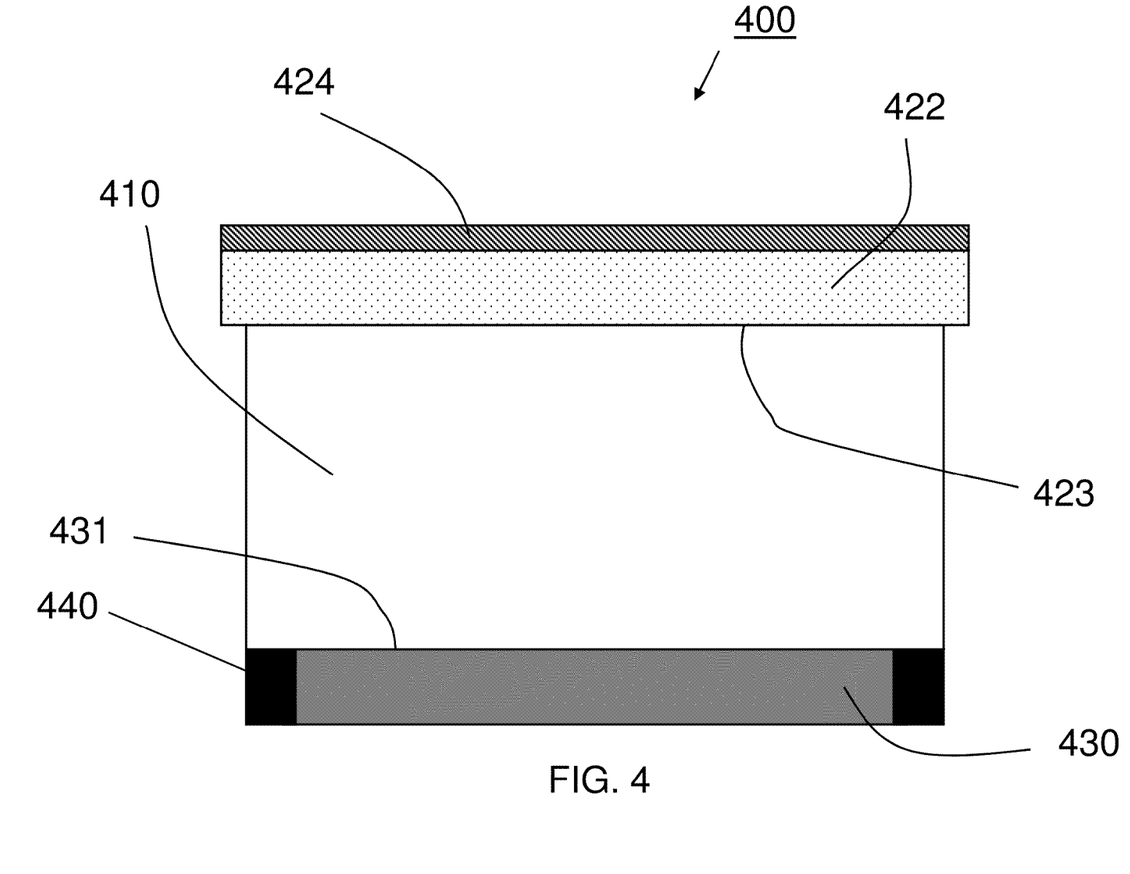
FIG. 4 shows a side cross-sectional view of other embodiments of a photovoltaic device protective barrier comprising a first encapsulant layer formed over a first major surface of a flexible glass layer, and a second encapsulant layer formed over a second major surface of the flexible glass layer.

FIG. 4 illustrates another embodiment 400 of a protective barrier 100 comprising high and/or low modulus layers that can be formed on or over at least one photovoltaic cell such as the photovoltaic cell 10 in FIG. 1. The protective layer 400 can comprise a flexible glass layer 410 formed over the at least one photovoltaic cell, for example, the at least one photovoltaic cell 10 of FIG. 1. The flexible glass layer 410 can have a first major surface 431 facing the at least one photovoltaic cell and a second major surface 423 facing away from the at least one photovoltaic cell (e.g., toward the Sun). Additionally, the photovoltaic cell 10 can comprise a flexible photovoltaic cell formed on a flexible substrate.

Protective barrier 400 may include one or more transparent sublayers, for example a first encapsulant layer 430, a second encapsulant layer 422, and an optional weather barrier 424.

The first encapsulant layer 430 can be formed over the first major surface 431 of the flexible glass layer 410, and can have a modulus of less than 100 MPa at room temperature, such as 2-50 MPa. For example, the first encapsulant layer 430 can comprise a polymer or glass layer having a modulus of less than 50 MPa at room temperature.

The second encapsulant layer 422 can be formed over the second major surface 423 of the flexible glass layer 410, and can comprise a composite material comprising a polymer matrix containing a filler material. The second encapsulant layer 422 may have a modulus above 100 MPa, such as above 500 MPa, for example 100-1000 MPa, including 500 to 1000 MPA.

Thus, a softer layer 430 is formed over the bottom, cell facing surface of the glass layer 410, and a harder layer 422 is formed over the top, Sun facing surface of the glass layer 410. The softer layer 430 provides a cushion which allows the glass layer 410 to bend or flex during impact on the glass layer 410. The harder layer 422 provides scratch and/or impact resistance to the glass layer 410.

The filler material can comprise at least one of fibers, scrim, nanotubes, nanowires and particles. For example, the filler material can comprise organic, inorganic or glass fibers which are weaved with preferred orientation or matted without preferred orientation. The filler material can alternatively comprise transparent particles, such as $SiO_2$, $TiO_2$ or the like. Additionally, the filler material can be of a size which is less than a thickness of the second encapsulant layer 422 to provide an impact resistance to the second encapsulant layer.

The polymer matrix can comprise a UV stable polymer having a modulus of less than 100 MPa at room temperature. Additionally, the filler material can increase a modulus of the composite material to at least 100 MPa at room temperature.

Low Modulus Encapsulating Layers

Alternatively, the first encapsulant layer 430 can have a modulus of less than 100 MPa at room temperature and the second encapsulant layer 422 can have a thickness of greater than 500 μm, and a modulus of less than 100 MPa at room temperature. In other words, soft encapsulating layers are formed on both sides of the flexible glass layer 410. The underlying layer 430 provides a cushion which allows the glass layer 410 to bend or flex during impact on the glass layer 410. The thick and soft overlying layer 422 absorbs the impact of the object and spreads the impact radius to lower the effect of the impact on the glass layer 410.

The first encapsulant layer 430 can comprise a polymer or glass layer having a modulus of less than 50 MPa at room temperature, such as 5-50 MPa, and the second encapsulant layer 422 can comprise a glass or polymer layer having a modulus of 5 to 50 MPa at room temperature and a thickness of 550 to 5000 μm.

High Modulus Glass/Polymer and Low Modulus Encapsulating Layers

Alternatively, the first encapsulant layer 430 can have a modulus of less than 100 MPa, such as 5-50 MPa at room temperature, and the second encapsulant layer 422 can have a thickness of less than 500 μm and a modulus of greater than 500 MPa at room temperature, such as 500-1000 MPa.

For example, the first encapsulant layer 430 can comprise a polymer or glass layer having a modulus of less than 50 MPa at room temperature. An example of a soft glass suitable for layer 430 is Wacker amorphous silicon polymer having a modulus of about 10 MPa.

The second encapsulant layer 422 can comprise a hard glass or polymer layer having a modulus of 500 to 1000 MPa at room temperature and a thickness of 50 to 250 μm. An example of a hard glass polymer is SentryGlas® architectural safety glass interlayer made by DuPont.

In the embodiments illustrated in FIG. 4, the encapsulant layers 422, 430 may decrease the impulse of impacts and/or increase the impact area when an object (e.g., hail, tree branches, etc.) impacts the barrier 100.

In the above embodiments, the at least one photovoltaic cell 10 can comprise a flexible photovoltaic cell formed on a flexible substrate and the photovoltaic device 1000 is flexible and can be rolled up in a roll. Additionally, in any of the above embodiments, an optional weather barrier 424 may be added over the protective or encapsulating layer(s). The weather barrier 424 can comprise a fluorinated polymer weather barrier and can be formed over the second encapsulant layer. For example, the fluorinated polymer can be ETFE, FEP, or the like.

It is to be understood that the present invention is not limited to the embodiments and the examples described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells described herein.

What is claimed is:

1. A photovoltaic device, comprising:
   at least one photovoltaic cell;
   a flexible glass layer formed over a top surface of the at least one photovoltaic cell;
   a first layer of a transparent planarizing hardcoat formed directly on a first major surface of the glass layer, wherein the first major surface faces away from the at least one photovoltaic cell;
   a second layer of the transparent planarizing hardcoat formed directly on a second major surface of the glass layer, wherein the second major surface faces toward the at least one photovoltaic cell, such that the glass layer and the photovoltaic cell are separated by the second layer of the planarizing hardcoat; and
   a transparent and abrasion resistant film comprising an organic-inorganic hybrid material formed on the first layer of the transparent planarizing hardcoat on the first major surface of the glass layer and on the second layer of the transparent planarizing hardcoat on the second major surface of the glass layer;
   wherein the first and the second layers of the transparent planarizing hardcoat are in compressive stress and the glass layer is in tension; and
   wherein the transparent and abrasion resistant film is further formed directly on at least two minor opposing surfaces of the glass layer.

2. The photovoltaic device of claim 1, wherein the glass layer has a thickness of 50-500 μm.

3. The photovoltaic device of claim 1, wherein the hardcoat has a thickness of 0.1-5 μm.

4. The photovoltaic device of claim 1, wherein the hardcoat is harder than the glass.

5. The photovoltaic device of claim 1, wherein the hardcoat comprises a moisture barrier.

6. The photovoltaic device of claim 1, wherein the photovoltaic device is flexible and is rolled up in a roll.

7. The photovoltaic device of claim 1, wherein a material comprising the hardcoat is selected from silsequioxane, silicon oxide formed from perhyodropolysilazane, aluminum phosphate, silicates, or alumina.

8. The photovoltaic device of claim 1, wherein the hardcoat prevents damage to the surface of the glass layer and prevents crack propagation.

9. A method of making a photovoltaic device, comprising:
   providing at least one photovoltaic cell;
   forming a flexible glass layer over a top surface of the at least one photovoltaic cell, wherein the flexible glass layer has a first layer and a second layer of a transparent planarizing hardcoat, wherein:
   the first layer of the transparent planarizing hardcoat is formed directly on a first major surface of the flexible glass layer;
   the second layer of the transparent planarizing hardcoat layer is formed directly on a second major surface of the flexible glass layer; and
   the first major surface faces away from the at least one photovoltaic cell and the second major surface faces toward the at least one photovoltaic cell such that the flexible glass layer and the photovoltaic cell are separated by the second layer of the planarizing hardcoat;
   wherein the first and the second layers of the transparent planarizing hardcoat are in compressive stress and the flexible glass layer is in tension; and
   forming a transparent and abrasion resistant film comprising an organic-inorganic hybrid material on the first layer of the transparent planarizing hardcoat, on the second layer of the transparent planarizing hardcoat, and directly on at least two minor opposing surfaces of the flexible glass layer.

10. The method of claim 9, wherein the glass layer has a thickness of 50-500 μm.

11. The method of claim 9, wherein the hardcoat planarizing has a thickness of 0.1-5 μm.

12. The method of claim 9, wherein the hardcoat is harder than the glass.

13. The method of claim 9, wherein the hardcoat comprises a moisture barrier.

14. The method of claim 9, further comprising rolling the photovoltaic device into a roll.

15. The method of claim 9, wherein a material comprising the hardcoat is selected from silsequioxane, silicon oxide formed from perhyodropolysilazane, aluminum phosphate, silicates, or alumina.

16. The method of claim 9, wherein the hardcoat in compression prevents damage to the surface of the glass layer and prevents crack propagation.

* * * * *